United States Patent
Shin et al.

(10) Patent No.: US 9,298,612 B2
(45) Date of Patent: Mar. 29, 2016

(54) SEMICONDUCTOR MEMORY DEVICE AND COMPUTER SYSTEM INCLUDING THE SAME

(71) Applicant: Samsung Electronics Co., Ltd.

(72) Inventors: Hyun-Sung Shin, Seoul (KR); Sang-Joon Hwang, Seoul (KR); Seung-Man Shin, Suwon-si (KR); In-Su Choi, Hwaseong-si (KR); Jung-Ho Jung, Suwon-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 316 days.

(21) Appl. No.: 14/015,536

(22) Filed: Aug. 30, 2013

(65) Prior Publication Data

US 2014/0143478 A1     May 22, 2014

(30) Foreign Application Priority Data

Nov. 20, 2012    (KR) ........................ 10-2012-0131980

(51) Int. Cl.
*G06F 13/38*    (2006.01)
*G06F 12/06*    (2006.01)
*G11C 11/00*    (2006.01)
*G06F 3/00*    (2006.01)
*G11C 29/44*    (2006.01)

(52) U.S. Cl.
CPC .............. *G06F 12/06* (2013.01); *G11C 11/005* (2013.01); *G06F 2212/205* (2013.01); *G11C 2029/4402* (2013.01)

(58) Field of Classification Search
None
See application file for complete search history.

(56) References Cited

U.S. PATENT DOCUMENTS

| | | | |
|---|---|---|---|
| 5,650,968 A | 7/1997 | Dosaka et al. | |
| 6,731,536 B1 | 5/2004 | McClain et al. | |
| 7,102,958 B2 | 9/2006 | Lee et al. | |
| 7,277,356 B2 | 10/2007 | Lee et al. | |
| 7,369,445 B2 | 5/2008 | Lee et al. | |
| 7,457,189 B2 | 11/2008 | Lee et al. | |
| 7,636,273 B2 | 12/2009 | Lee et al. | |
| 7,804,720 B2 | 9/2010 | Lee et al. | |
| 7,911,839 B2 | 3/2011 | Ahmed | |
| 7,991,943 B2 | 8/2011 | Berenbaum et al. | |
| 8,243,492 B2 | 8/2012 | Park | |
| 2008/0175071 A1 | 7/2008 | Lee et al. | |
| 2009/0019275 A1 | 1/2009 | Park et al. | |
| 2013/0086309 A1* | 4/2013 | Lee et al. ............ | G06F 12/0246 711/103 |

FOREIGN PATENT DOCUMENTS

| KR | 10-10-0630726 A | 10/2005 |
|---|---|---|
| KR | 10-2009-0007123 A | 1/2009 |
| KR | 10-2010-0078244 A | 7/2010 |

* cited by examiner

*Primary Examiner* — Scott Sun
(74) *Attorney, Agent, or Firm* — Muir Patent Law, PLLC

(57) ABSTRACT

A semiconductor memory device includes a first memory block of a first type of memory; and a second memory block of a second type of memory having a different type from the first type. A first address region of the first memory block and a second address region of the second memory block are included in the same address domain. Each of the first and second memory blocks is accessed by an address signal including an address of the address domain, and the second memory block is a nonvolatile memory.

18 Claims, 11 Drawing Sheets

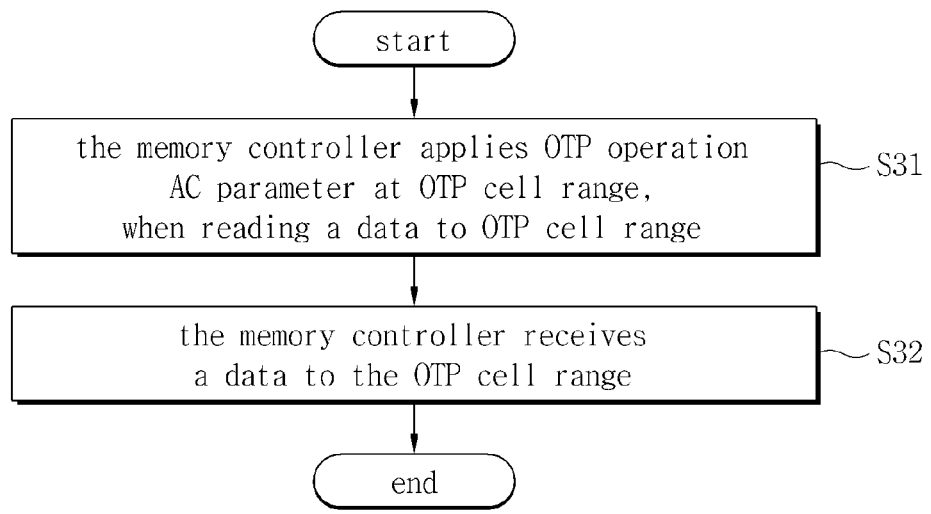
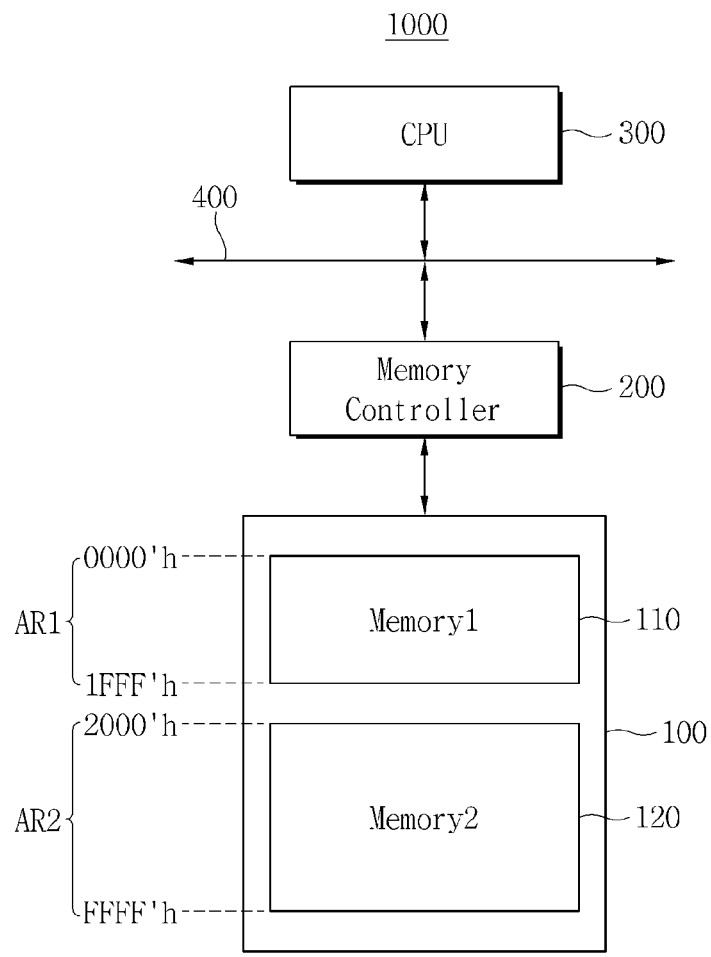

SEMICONDUCTOR MEMORY DEVICE AND COMPUTER SYSTEM INCLUDING THE SAME

CROSS-REFERENCE TO RELATED APPLICATION

This application claims priority under 35 U.S.C. §119 to Korean Patent Application No. 10-2012-0131980 filed on Nov. 20, 2012, the disclosure of which is hereby incorporated by reference in its entirety.

BACKGROUND

A computer system may typically be formed including a plurality of memories arranged in various hierarchical structures. The highest level memories feature the highest performance, the highest price and the lowest capacity, while the lowest level memories have the reverse characteristics to the highest level memories. The highest level memories correspond to a register, a cache, an SRAM, etc., and the lowest level memories correspond to a hard disk drive (HDD), an optical disk drive (ODD), etc.

As a central processing unit (CPU) is generally configured in pipeline architecture, managing such hierarchical memories with efficiency is thus regarded as important in determining the performance of a computer system.

SUMMARY

Exemplary embodiments are directed to provide a semiconductor memory device with different memories which are fabricated in a unitary die and controlled by address signals.

The embodiments are further directed to provide a computer system including such a semiconductor memory device.

In accordance with one embodiment, a semiconductor memory device may include a first memory block of a first type of memory and a second memory block of a second type of memory that is different from the first type. A first address region of the first memory block and a second address region of the second memory block may be included in the same address domain. Each of the first and second memory block may be accessed by an address signal including an address of the address domain. The second memory block may be a nonvolatile memory.

The same address domain may refer to a set of consecutive addresses, wherein the addresses of the second address region immediately follow the addresses of the first address region.

The first and second memory block may be each driven by different AC parameters.

The first and second memory block may be fabricated in a unitary die.

The first and second memory block may be each made by different memory fabrication processes.

The first memory block may be used as a system operating memory.

The first memory block may include a volatile memory, such as DRAM.

The second memory block may be used for storing data.

The nonvolatile memory may include one of a flash memory device, Ferroelectric Random Access Memory (Fe-RAM), Phase-change Random Access Memory (PRAM), and Magnetic Random Access Memory (MRAM).

In accordance with another embodiment, a computer system may include a semiconductor memory device having a first memory block and a second memory block that has different operational characteristics from the first memory block, a memory controller configured to access the first and second memory block by an address signal, and a central processing unit configured to, by way of the memory controller, allocate a memory space to the first memory for system management and a memory space to the second memory block for data storage.

An address region of the semiconductor memory device may include a first address region for accessing the first memory and a second address region for accessing the second memory.

The first and second memory block may be each driven by different AC parameters.

The first and second memory block are fabricated in a unitary die.

The first and second memory block may be each made by different memory fabrication processes.

The second memory block may be a nonvolatile memory.

The nonvolatile memory may include one of a flash memory device, Ferroelectric Random Access Memory (Fe-RAM), Phase-change Random Access Memory (PRAM), and Magnetic Random Access Memory (MRAM).

In another embodiment, a memory access method in a semiconductor memory device that includes a first memory block of a first type of memory on a die and a second memory block of a second type of memory having a different type from the first type on the same die is disclosed. The memory access method includes accessing a first address region of the first memory block by a first address signal including a first address, and accessing a second address region of the second memory block by a second address signal including a second address. The first address and second address may be part of the same address domain, and the second memory block may be a nonvolatile memory.

The first memory block may be a volatile memory.

The same address domain may include a set of consecutive addresses, wherein the addresses of the second address region immediately follow the addresses of the first address region.

The first memory block may be used as memory space for managing a computer system, and the second memory block may be used as memory space for storing data.

In one embodiment, first AC parameters are applied to the first address region, and second AC parameters are applied to the second address region. The second AC parameters are different from the first AC parameters.

BRIEF DESCRIPTION OF THE DRAWINGS

The foregoing and other features and advantages will be apparent from the more particular description of the disclosed embodiments, as illustrated in the accompanying drawings in which like reference characters refer to the like parts throughout the different views. The drawings are not necessarily to scale, emphasis instead being placed upon illustrating the principles of the inventive concepts. In the drawings:

FIG. 6 is a flowchart showing an exemplary procedure for reading data out of the OTP cell region 120 of FIGS. 3A and 3B, according to one embodiment;

FIG. 7 is a block diagram illustrating an exemplary computer system 1000 with the semiconductor memory device 100 of FIG. 2, according to one embodiment;

DETAILED DESCRIPTION

Figure 1:
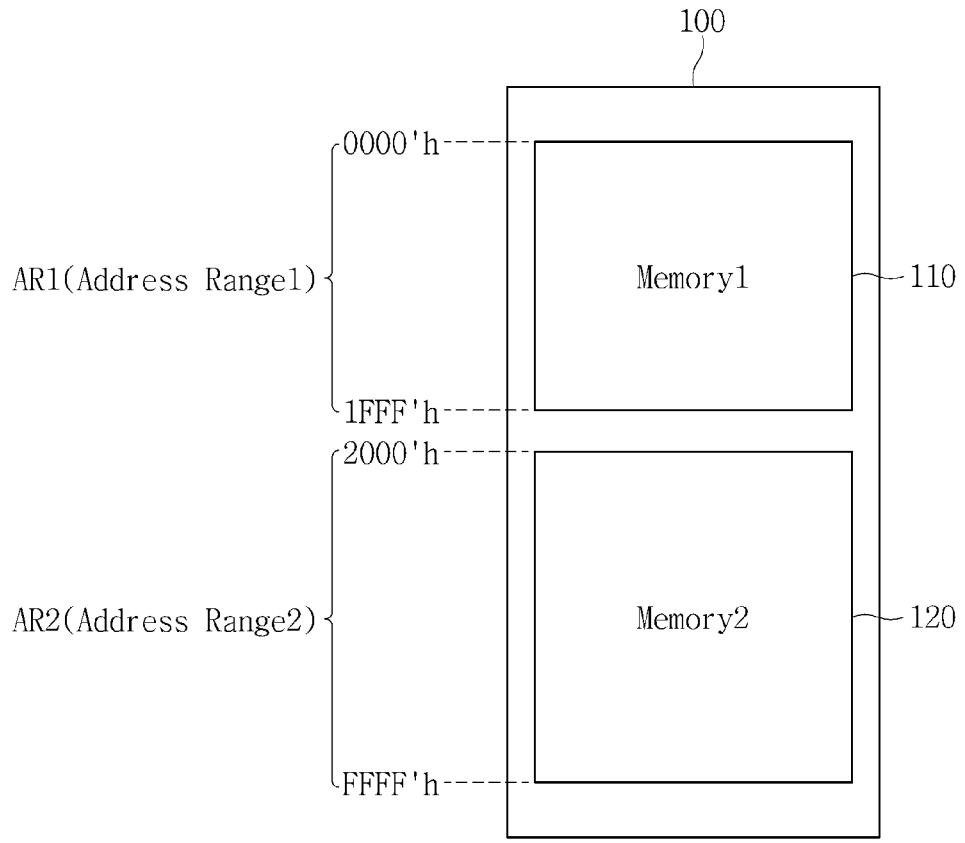
FIG. 1 is a block diagram illustrating a semiconductor memory device 100 according to one exemplary embodiment.

Embodiments are described below in sufficient detail to enable those of ordinary skill in the art to embody and practice the inventive concept. It is important to understand that the inventive concept may be embodied in many alternate forms and should not be construed as limited to the embodiments set forth herein.

Accordingly, while the inventive concept is susceptible to various modifications and may take on various alternative forms, specific embodiments thereof are shown by way of example in the drawings and will herein be described in detail.

It will be understood that, although the terms first, second, etc. may be used herein to describe various elements, these elements should not be limited by these terms. Unless indicated otherwise, these terms are only used to distinguish one element from another. For example, a first element could be termed a second element, and, similarly, a second element could be termed a first element, without departing from the scope of the inventive concept.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (i.e., "between" versus "directly between", "adjacent" versus "directly adjacent", etc.).

The terminology used herein to describe exemplary embodiments is not intended to limit the scope of the inventive concept. The articles "a," "an," and "the" are singular in that they have a single referent, however the use of the singular form in the present document should not preclude the presence of more than one referent. In other words, elements of the inventive concept referred to in the singular may number one or more, unless the context clearly indicates otherwise. It will be further understood that the terms "comprises," "comprising," "includes," and/or "including," when used herein, specify the presence of stated features, items, steps, operations, elements, and/or components, but do not preclude the presence or addition of one or more other features, items, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

It should also be noted that in some alternative implementations, the functions/acts noted in the blocks may occur out of the order noted in the flowcharts. For example, two blocks shown in succession may in fact be executed substantially concurrently or the blocks may sometimes be executed in the reverse order, depending upon the functionality/acts involved.

The disclosure will now be described more fully with reference to the accompanying drawings, in which embodiments of the inventive concept are shown.

Disclosed embodiments relate to a semiconductor memory device, and more particularly, to a semiconductor memory device including different memories and accessing the memories by address signals and a computer system including the semiconductor memory device.

FIG. 1 is a block diagram illustrating a semiconductor memory device 100 according to one exemplary embodiment.

Referring to FIG. 1, the semiconductor memory device 100 includes a first memory block 110 and a second memory block 120. In one embodiment, the semiconductor memory device 100 includes different kinds of memories. For example, if the first memory block 110 is volatile like a dynamic random access memory (DRAM), the second memory block 120 may be nonvolatile. The second memory block 120 may include, for example, a Ferroelectric Random Access Memory (FeRAM), a Phase-change Random Access Memory (PRAM), a Magnetic Random Access Memory (MRAM), a flash memory device, etc.

The semiconductor memory device 100 may be formed including the different kinds of the first and second memory blocks 110 and 120 which are integrated in a unitary die. Therefore, the first and second memory blocks 110 and 120 can be on the same chip. Accordingly, different memory fabrication processes may be used in order to fabricate the first and second memory blocks 110 and 120, which are different in kind, or type, in a unitary die. For example, if the first memory block 110 is a DRAM, a high integration DRAM process may be used to fabricate the first memory block 110. As also, if the second memory block 120 is a flash memory, an embedded flash memory process may be used to fabricate the second memory block 120.

The first and second memory devices 110 and 120 may be controlled by way of address signals. For example, in one embodiment, a first address region, also described as a range, AR1 of the first memory block 110 is set as 0000'h to 1FFF'h (hexadecimal code). A second address region, also described as a range, AR2 of the second memory block 120 is set as 2000'h to FFFF'h.

Depending on which address regions an address signal belongs to, the semiconductor memory device 100 may determine a memory block to be accessed (e.g., depending on which address region the address signal belongs to, the memory block to be accessed in the semiconductor memory device 100 may vary.) In one embodiment, the first address region AR1 and the second address region AR2 are included in the same address domain.

Figure 2:
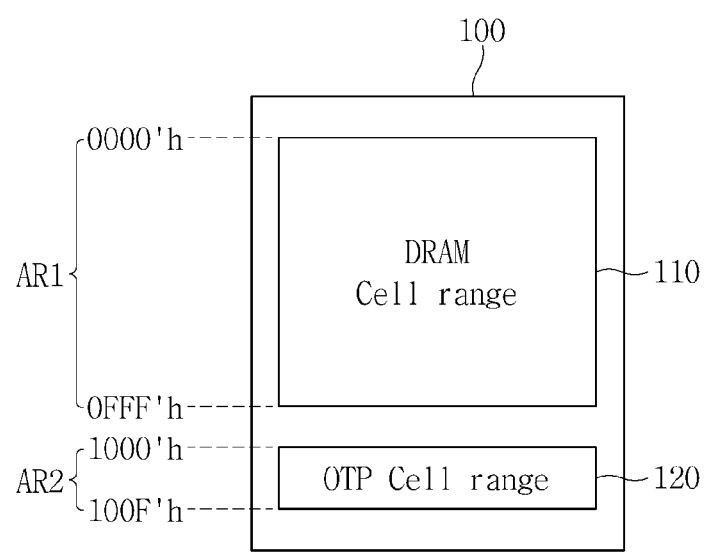
FIG. 2 is a block diagram illustrating an exemplary semiconductor memory device 100 shown in FIG. 1, implemented in a DRAM 100, according to one embodiment.

FIG. 2 is a block diagram illustrating an exemplary semiconductor memory device 100 of FIG. 1 that is implemented as a DRAM 100.

Referring to FIG. 1 and FIG. 2, the first memory block 110 is implemented as the DRAM cell region 110 and the second memory block 120 is implemented as an OTP cell region 120.

The DRAM 100 includes the DRAM cell region 110 and the OTP cell region 120. The DRAM cell region 110 and the OTP cell region are each controlled by the same address domain. For example, in one embodiment, the first address region AR1 of the DRAM cell region 110 is ranged from 0000'h to 0FFF'h. The second address region AR2 of the OTP cell region 120 is ranged from 1000'h to 100F'h. Accordingly, the address domain may be set from 0000'h to 100F'h.

While the OTP cell region 120 is typically programmed during a fabrication process, the DRAM 100 according to an exemplary embodiment is programmed after the fabrication process.

Figure 3A:
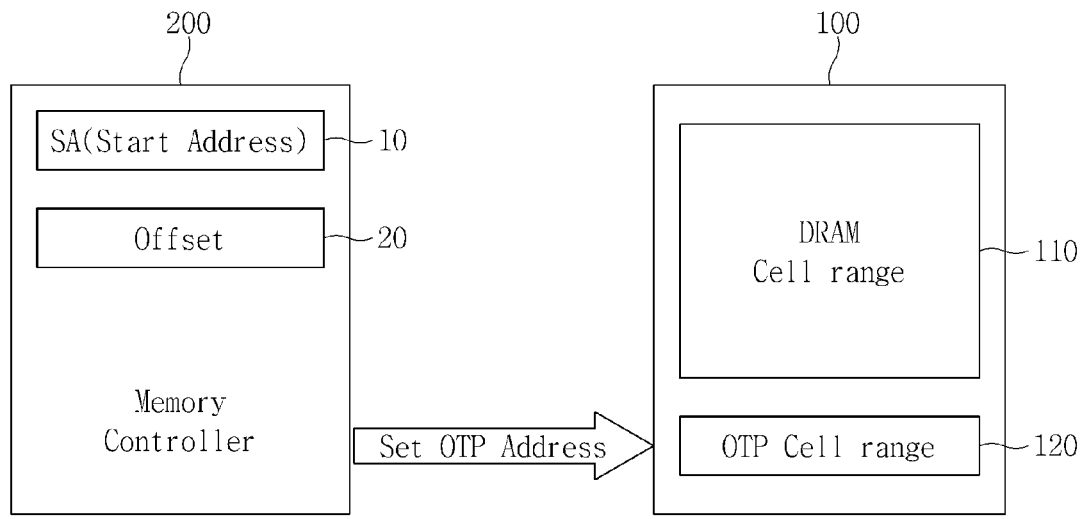
FIGS. 3A and 3B are block diagrams illustrating an exemplary semiconductor memory device 100 of FIG. 2 and a memory controller 200, according to one embodiment.
Figure 3B:
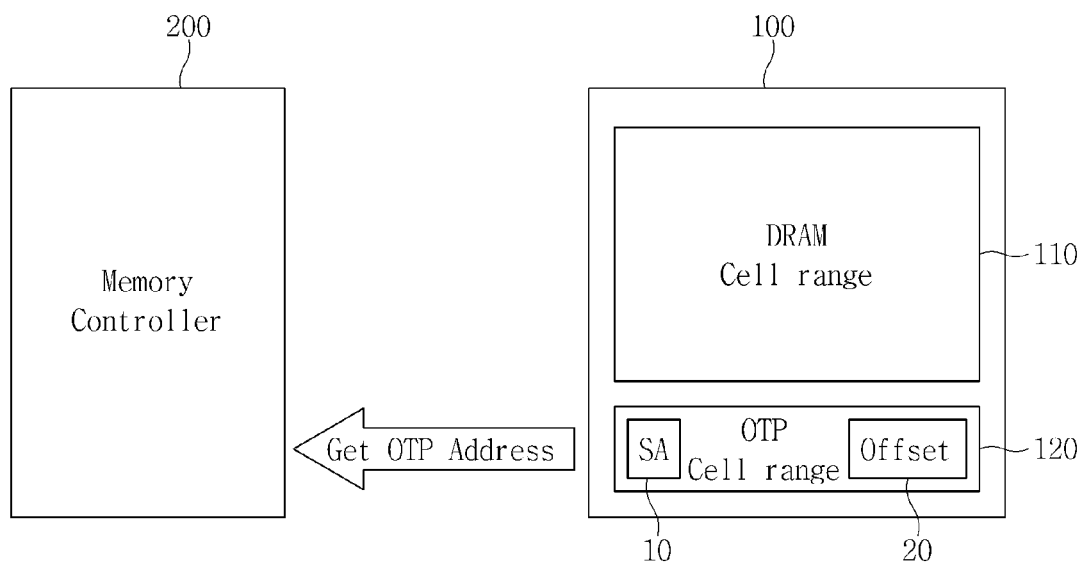

FIGS. 3A and 3B are block diagrams illustrating an exemplary semiconductor memory device 100 of FIG. 2 and a memory controller 200.

FIG. 3A depicts that the memory controller 200 sets a start address 10 and a offset 20 for the OTP cell region 120, and FIG. 3B depicts that the memory controller 200 receives the start address 10 and the offset 20 from the OTP cell region 120.

Referring to FIG. 2 and FIG. 3A, the memory controller 200 includes the start address 10 and the offset 20 for accessing the OTP cell region 120. The start address 10 is the first address of the OTP cell region 120. The offset 20 is a difference between the start address 10 and the last address of the OTP cell region 120. Namely, as shown in FIG. 2, the start address 10 at the OTP cell region 120 is 1000'h and the offset 20 at the OTP cell region 120 is F'h (i.e. '16' in decimal code).

The memory controller 200 stores the start address 10 and the offset 20 in the OTP cell region 120. The memory controller 200 can use a Mode Register Set (MRS) in order to transfer the start address 10 and the offset 20 to the OTP cell region 120.

Generally, in the DRAM, an operation mode to be exploited by the memory controller 200, which is calibrated by CAS (column address strobe) latency, a burst length, etc., is set in advance. And then, the DRAM may be accessed.

A exemplary place for setting and storing such an operation mode is a mode register. And the congregation of mode registers is called a mode register set (hereinafter referred to as "MRS").

Referring to FIG. 2 and FIG. 3B, the memory controller 200 is initialized after storing the start address 10 and the offset 20 in the OTP cell region 120, or receives the start address 10 and the offset 20 from the OTP cell region 120 after power-off. The memory controller 200 can access the OTP cell region 120 by way of the start address 10 and the offset 20.

An exemplary procedure for driving the memory controller 200 of FIGS. 3A and 3B will be described with reference to FIG. 4 through FIG. 6 in detail. And an exemplary procedure for setting an address at the OTP cell region 120 by the memory controller 200 will be detailed with reference to FIG. 4.

Additionally, a procedure for writing data into the OTP cell region 120 after the memory controller 200 sets an address to the OTP cell region 120 will be described in conjunction with FIG. 5. And a procedure for reading the OTP cell region 120 will be described referring to FIG. 6.

Figure 4:
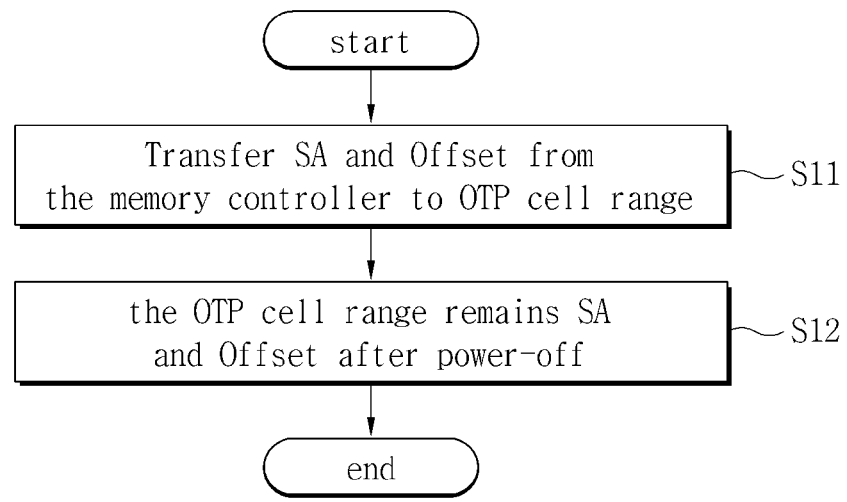
FIG. 4 is a flowchart showing an exemplary procedure for setting an address to an OTP cell region 120 of FIGS. 3A and 3B, according to one embodiment.

FIG. 4 is a flowchart illustrating the procedure for setting an address to the OTP cell region 120 of FIGS. 3A and 3B.

Referring first to FIG. 2 through FIG. 3A, a programmer (i.e. a user) accessing the OTP cell region 120 determines a start address and an offset of the OTP cell region 120. Then the user (i.e., the programmer) stores the start address 10 and the offset 20, which are to be used for accessing the OTP cell region 120, in the memory controller 200.

In step S11, the memory controller 200 transfers the start address 10 and the offset 20, which are to be used for accessing the OTP cell region 120, to the OTP cell region 120. For example, the memory controller 200 transfers 1000'h as the start address 10 and F'h as the offset 20.

In step S12, the OTP cell region 120 continually keeps the start address 10 and the offset 20 even during the power-off or an initializing step.

Figure 5:
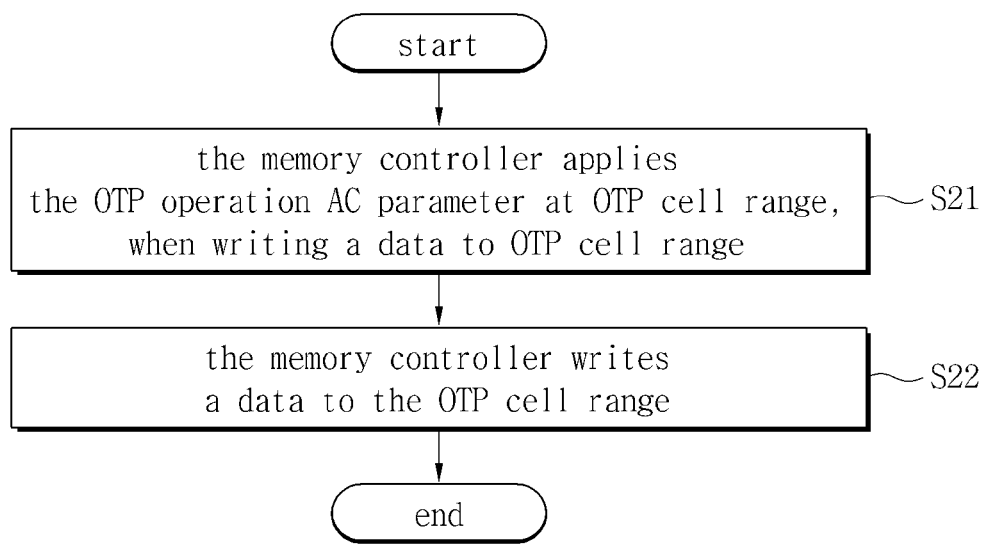
FIG. 5 is a flowchart showing an exemplary procedure for writing data into the OTP cell region 120 of FIGS. 3A and 3B, according to one embodiment.

FIG. 5 is a flowchart showing an exemplary procedure for writing data into the OTP cell region 120 of FIGS. 3A and 3B.

Referring to FIG. 2, FIG. 3A, FIG. 3B and FIG. 5, the memory controller 200 usually applies normally operating AC parameters to the DRAM cell region 110 in order to access the DRAM cell region 110.

Since the OTP cell region is different from the DRAM cell region in operation rate, the AC parameters are differently applied to the OTP cell region 120, which may be called OTP operative AC parameters, dissimilar to the DRAM cell region 110.

In step S21, the memory controller 200 applies the OTP operative AC parameters to the OTP cell region 120 in order to write data into the OTP cell region 120.

In step S22, the memory controller 200 writes data into the OTP cell region 120.

FIG. 6 is a flowchart showing an exemplary procedure for reading data from the OTP cell region 120 of FIGS. 3A and 3B.

Referring to FIG. 2, FIG. 3A, FIG. 3B and FIG. 6, in step S31, the memory controller 200 applies the OTP operative AC parameters to the OTP cell region 120 in order to read data from the OTP cell region 120.

In step S32, the memory controller 200 receives data from the OTP cell region 120.

FIG. 7 is a block diagram illustrating an exemplary computer system 1000 with the semiconductor memory device 100 of FIG. 2.

Referring to FIG. 2 through FIG. 7, the computer system 1000 includes the semiconductor memory device 100 of FIG. 2, the memory controller 200, a central processing unit 300 and a system bus 400.

In one embodiment, the central processing unit 300 directly allocates a memory space (region) of the semiconductor memory device 100 by way of the memory controller 200.

For example, the central processing unit 300 can allocate the first memory block 110 as a memory space for managing the computer system 1000, and the second memory block 120 as a memory space for storing data. A computer system is generally complicated in a hierarchical memory structure and also has complex access layers for controlling the memories. However, the semiconductor memory device 100 according to various disclosed embodiments is configured to include different kinds of memories in a unitary die. Moreover, such different memories are assigned to the same memory domain. Thus, the computer system 1000 according to exemplary embodiments may have a simpler hierarchical memory structure. Therefore, the computer system 1000 can be accessed more easily.

Figure 8:
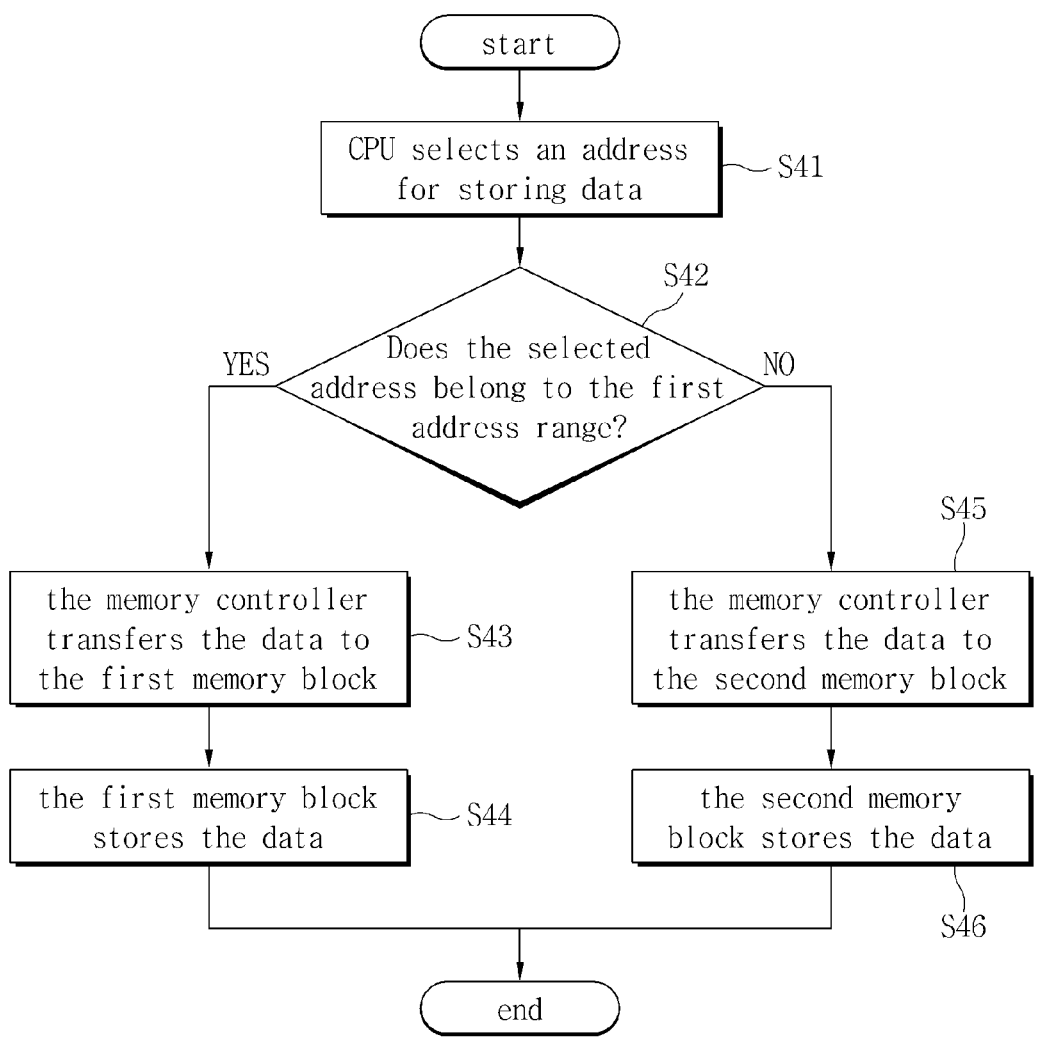
FIG. 8 is a flowchart showing an exemplary writing operation in the computer system 1000 of FIG. 7, according to one embodiment.

FIG. 8 is a flowchart showing an exemplary writing operation in the computer system 1000 of FIG. 7.

Referring to FIG. 7 and FIG. 8, first, the central processing unit 300 allocates the first memory block 110 as a memory space for managing the computer system 1000, and the second memory block 120 as a memory space for storing data.

In step S41, the central processing unit 300 selects an address for storing data. If the data is to be used for operating the computer system, the data may be stored in the first address region AR1. If not, the data may be stored in the second address region AR2.

In step S42, if the selected address belongs to the first address region AR1, steps S43 and S44 are performed. If not, steps S45 and S46 steps are performed.

In step S43, the memory controller 200 transfers the data to the first memory block 110 in response to the operative AC parameters of the first memory block 110.

In step S44, the first memory block 110 stores the data and the procedure terminates.

In step S45, the memory controller 200 transfers the data to the second memory block 120 in response to the operative AC parameters of the second memory block 120.

In step S46, the second block 120 stores the data and the procedure terminates.

Figure 9:
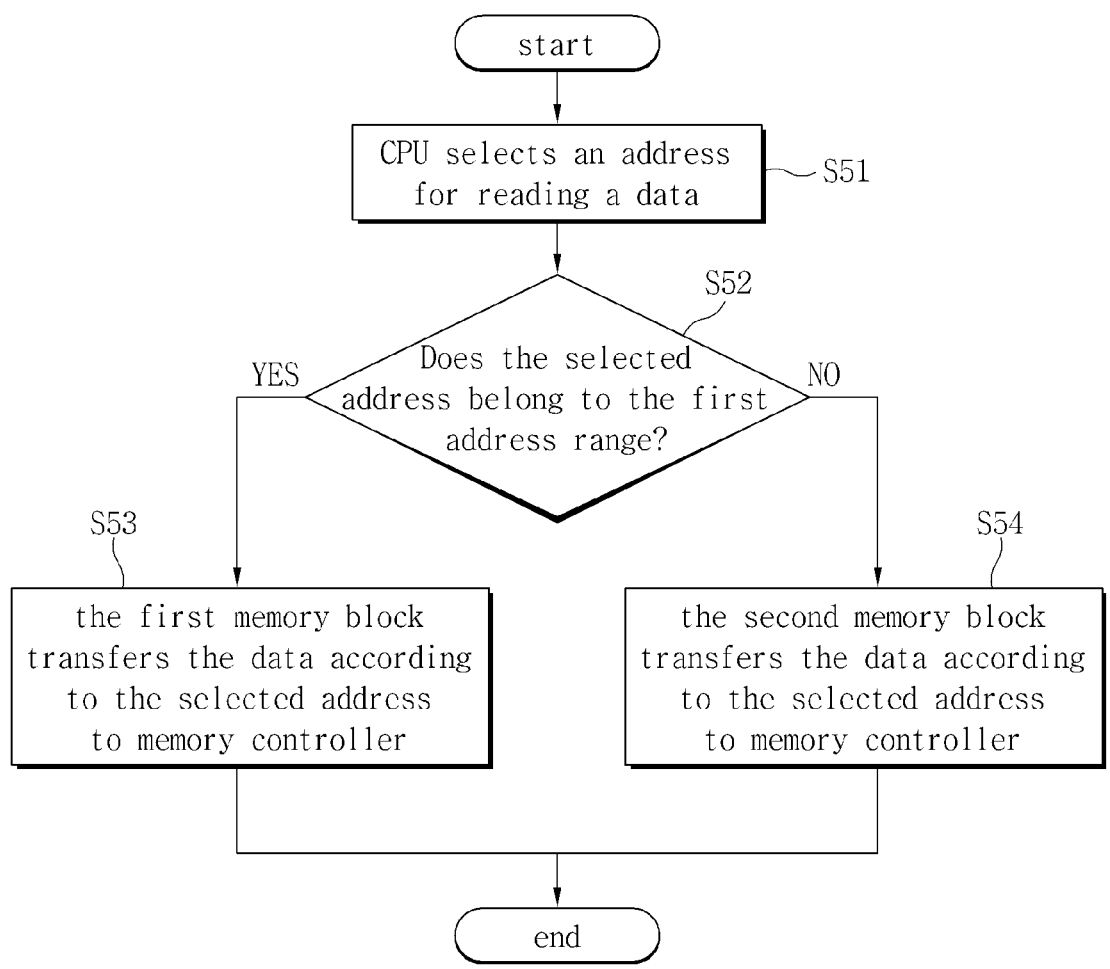
FIG. 9 is a flowchart showing an exemplary reading operation in the computer system 1000 of FIG. 7, according to one embodiment.

FIG. 9 is a flowchart showing an exemplary reading operation in the computer system 1000 of FIG. 7.

Referring to FIG. 7 and FIG. 9, first, the central processing unit 300 allocates the first memory block 110 as a memory space for managing the computer system 1000 and the second memory block 120 as a memory space for storing data.

In step S51, the central processing unit 300 selects an address for reading data.

In step S52, if the selected address is the first address region AR1, step S53 is performed. If not, step S54 is performed.

In step S53, the first memory block 110 transfers the data, which accords to the selected address, to the memory controller 200 and the procedure terminates.

In step S54, the second memory block 120 transfers the data, which accords to the selected address, to the memory controller 200 and the procedure terminates.

Figure 10:
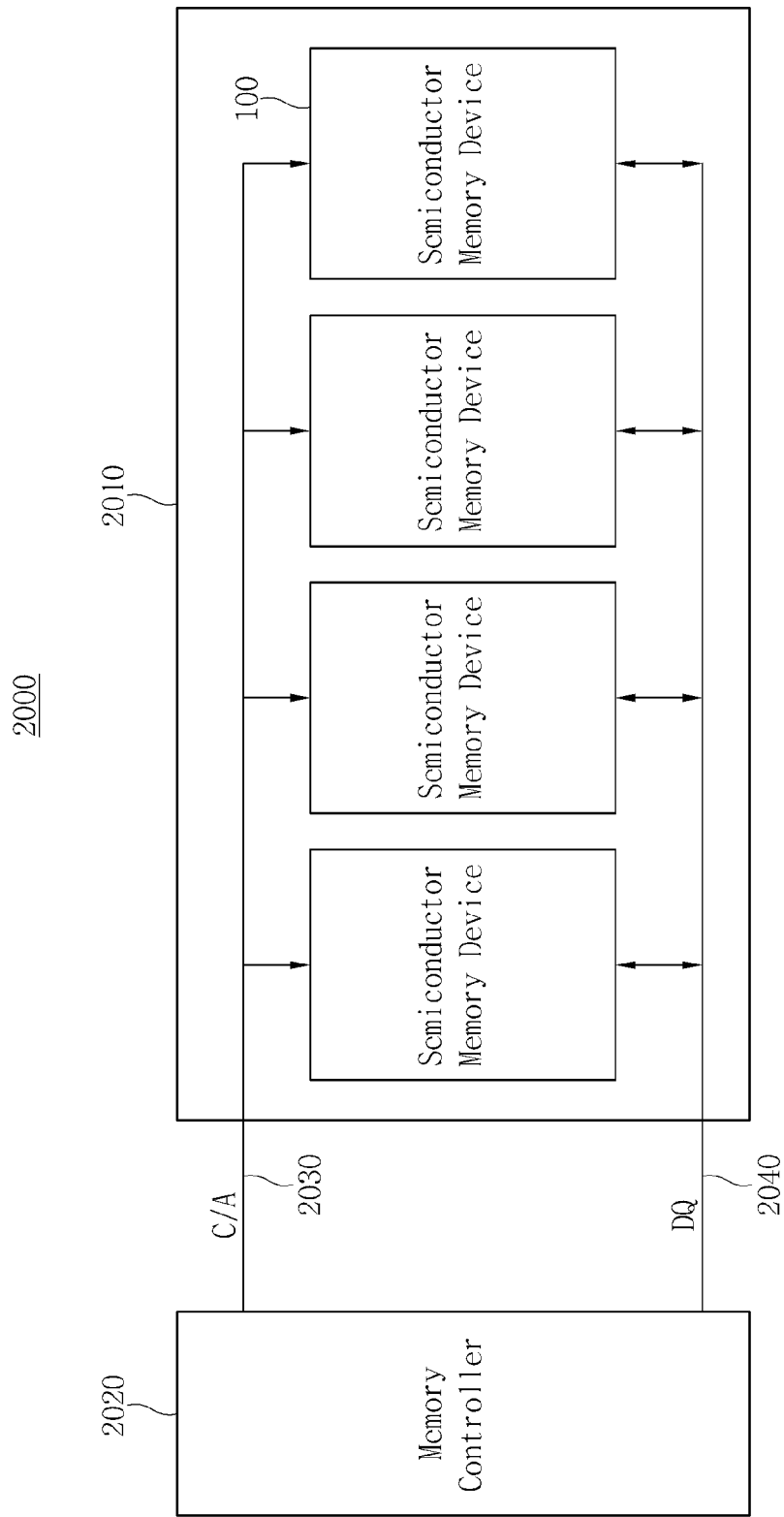
FIG. 10 is a block diagram illustrating an exemplary memory system 2000 including a semiconductor memory device 100 of FIG. 1, according to one embodiment.

FIG. 10 is a block diagram illustrating an exemplary memory system 2000 with the semiconductor memory device 100 of FIG. 1.

Referring to FIG. 10, the memory system 2000 includes a memory module 2010 having the semiconductor memory device 100 of FIG. 1, and a memory controller 2020 controlling the memory module 2010.

The memory module 2010 may be implemented to include more members in addition to the semiconductor memory devices 100 illustrated herein. And, the four semiconductor memory devices 100 attached to the memory module 2010 may be mounted on both surfaces of a substrate of the memory module 2010.

The memory controller 2020 generates a command/address signal C/A and a data signal DQ. The memory module 2010 operates in response to the command/address signal C/A and the data signal DQ. The command/address signal C/A may be packet data in which a command signal is combined with an address signal in a packet type.

The memory system 2000 may further include a command/address bus 2030 and a data bus 2040.

The command/address bus 2030 is configured in a fly-by structure and electrically connects the four semiconductor memory devices 100 with each other. The data signal DQ may be transferred between the memory controller 2020 and the memory module 2010 through the data bus 2040.

Figure 11:
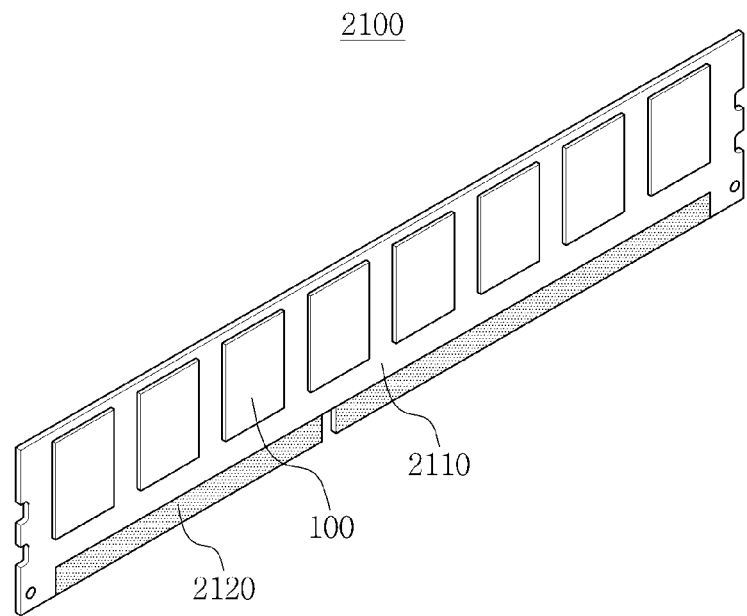
FIGS. 11 through 13 are diagrams illustrating exemplary memory modules 4100, 4200, and 4300 including the DRAM devices 100 of FIG. 1, according to one embodiment.
Figure 12:
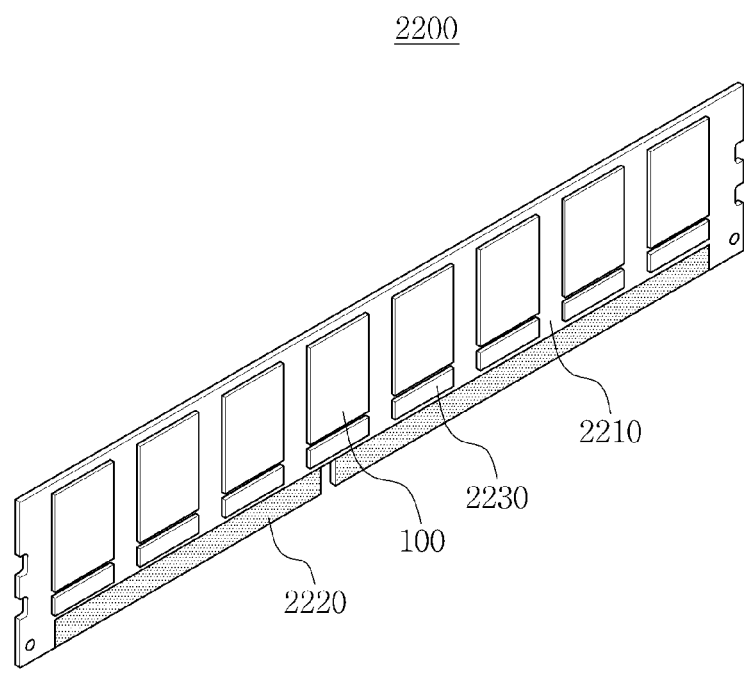
Figure 13:
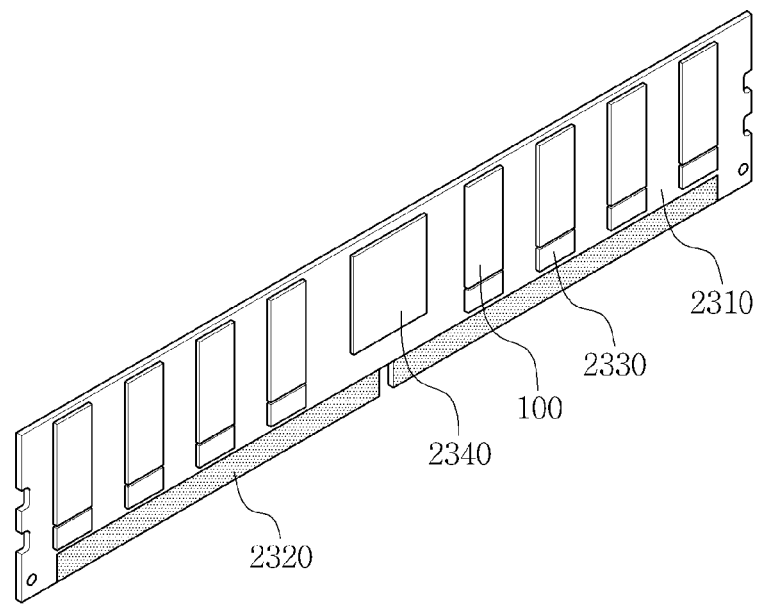

FIGS. 11 through 13 are diagrams illustrating memory modules 2100 to 2300, each of which include the semiconductor memory devices 100 of FIG. 1.

Referring to FIG. 11, the memory module 2100 includes the plurality of semiconductor memory devices 100, a printed circuit board (PCB) 2110, and a connector 2120. The plurality of semiconductor memory devices 100 may be each bonded to the top and bottom surfaces of the PCB 2110. The connector 2120 is electrically connected to the plurality of semiconductor memory devices 100 through conductive wires (not shown). The connector 2120 may be also coupled to a slot of an external host.

Referring to FIG. 12, the memory module 2200 includes the plurality of semiconductor memory devices 100, a PCB 2210, a connector 2230, and a plurality of buffers 2230. Each of the plurality of buffers 2230 may be disposed between the corresponding one of the semiconductor memory devices 100 and the connector 2220.

The plurality of buffers 2230 connected each to the plurality of semiconductor memory devices 100 respectively may be provided on the top and bottom surfaces of the PCB 2210. The semiconductor memory devices 100 and the plurality of buffers 2230 formed on the top and bottom surfaces of the PCB 2210 may be connected through a plurality of via holes, respectively.

Referring to FIG. 13, the memory module 2300 includes the plurality of semiconductor devices 100, a PCB 2310, a connector 2320, a plurality of buffers 2330, and a controller 2340.

The plurality of buffers 2330 connected each to the plurality of semiconductor memory devices 100 may be provided on the top and bottom surfaces of the PCB 2310. The plurality of semiconductor memory devices 100 and the plurality of buffers 2340 formed on the top and bottom surfaces of the PCB 2310 may be connected through a plurality of via holes, respectively. The controller 2340 transfers a control signal to the plurality of semiconductor memory devices 100, and transceives data to and from the semiconductor memory devices 100.

Figure 14:
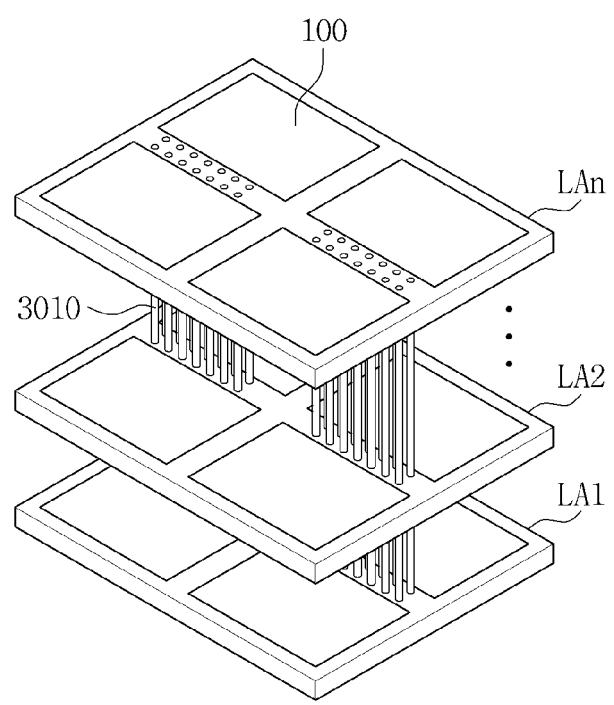
FIG. 14 is a schematic view illustrating an exemplary stacked semiconductor device 4400 including a plurality of semiconductor layers, according to one embodiment.

FIG. 14 is a schematic diagram illustrating an exemplary stacked semiconductor device 3000 equipped with a plurality of semiconductor layers. In the module structures of FIGS. 11 through 13, each of the semiconductor memory devices 100 may include a plurality of semiconductor layers LA1 to LAn.

Referring to FIG. 14, in the stacked semiconductor device 3000, the plurality of stacked semiconductor layers LA1 to LAn may be interconnected with each other by way of through substrate vias, such as through silicon vias (TSVs) 3010.

Figure 15:
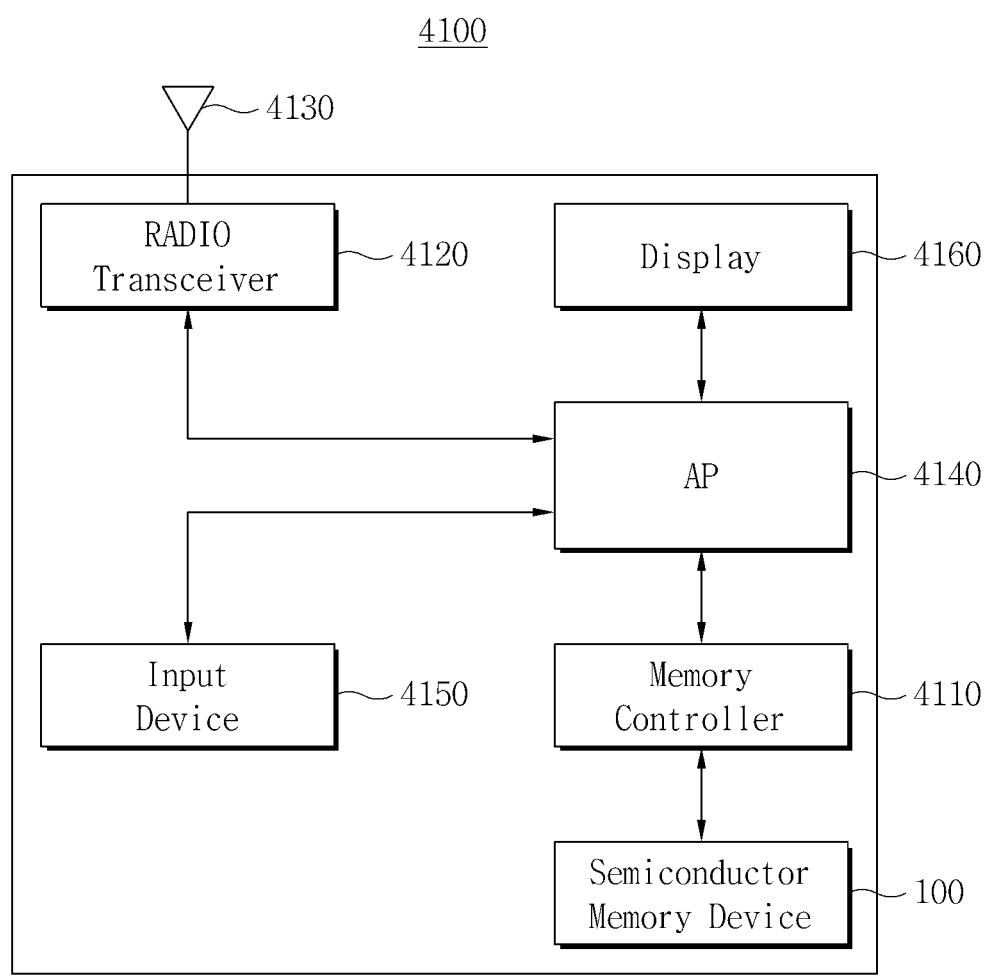
FIG. 15 illustrates an exemplary embodiment of a computer system 4100 including the semiconductor memory device 100 of FIG. 1.

FIG. 15 illustrates an exemplary embodiment relative to a computer system 4100 including the semiconductor memory device 100 of FIG. 1.

Referring to FIG. 15, the computer system 4100 includes a semiconductor memory device 100, a memory controller 4110 controlling the semiconductor memory device 100, a wireless transceiver 4120, an antenna 4130, an application processor 4140, an input device 4150, and a display device 4160.

The wireless transceiver 4120 may receive and transmit a wireless signal through the antenna 4130. For example, the wireless transceiver 4120 may modulate a wireless signal, which is received through the antenna 4130, into a signal that can be processed in the application processor 4140.

Accordingly, the application processor 4140 may process a signal, which is output from the wireless transceiver 4120, and transfer the processed signal to the display device 4160. The wireless transceiver 4120 may modulate the signal, which is output from the application processor 4140, into a wireless signal, and output the modulated wireless signal to an external device (e.g. a host) through the antenna 4130.

The input device 4150 is used as a device capable of inputting control signals for controlling an operation of the application processor 4140 or data to be processed by the application processor 4140, and may be implemented in a keypad, a keyboard, or a pointing device such as touch pad or a computer mouse.

According to an embodiment, the memory controller 4110 capable of controlling an operation of the semiconductor memory device 100 may be implemented as a part of the application processor 4140 or as another chip in addition to the application processor 4140.

Figure 16:
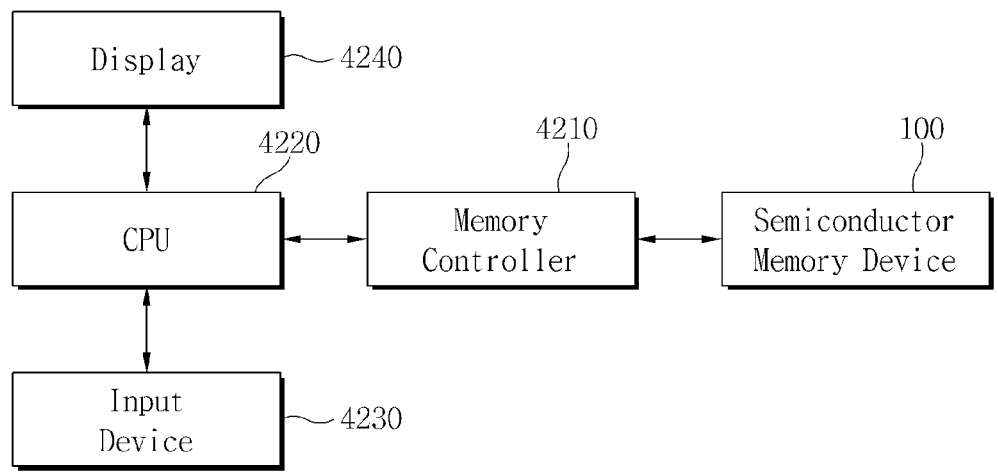
FIG. 16 illustrates another exemplary embodiment of a computer system 4200 including the semiconductor memory device 100 of FIG. 1.

FIG. 16 illustrates another exemplary embodiment of a computer system 4200 including the semiconductor memory device 100 of FIG. 1.

Referring to FIG. 16, the computer system 4200 may be implemented in a personal computer (PC), a network server, a tablet PC, a net-book, an e-reader, personal digital assistant (PDA), a portable multimedia player (PMP), an MP3 player, an MP4 player, for example.

The computer system 4200 includes a semiconductor memory device 100, a memory controller 4210 to control a data processing operation of the semiconductor memory device 100, a central processing unit 4220, a input device 4230, and a display device 4240.

The central processing unit 4220 may output data from the semiconductor memory device 100 through the display device 4240. For example, the input device 4230 may be implemented in a keypad, a keyboard, or a pointing device such as a touch pad or a computer mouse. The central processing unit 4220 can control an overall operation of the computer system 4200 and an operation of the memory controller 4210.

According to an embodiment, the memory controller 4210 capable of controlling an operation of the semiconductor memory device 100 may be implemented as a part of the central processing unit 4220 or as another chip in addition to the central processing unit 4220.

Figure 17:
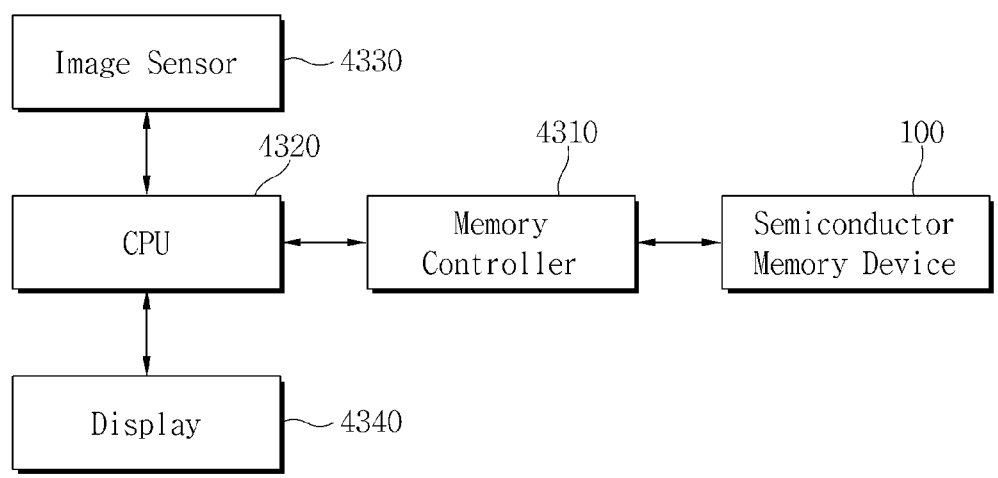
FIG. 17 illustrates still another exemplary embodiment of a computer system 4300 including the semiconductor memory device 100 of FIG. 1.

FIG. 17 illustrates still another exemplary embodiment of a computer system 4300 including the semiconductor memory device 100 of FIG. 1.

Referring to FIG. 17, the computer system 4300 may be implemented in an image process device such as a digital camera, a mobile telephone equipped with a digital camera, a smart phone or a tablet PC.

The computer system 4300 includes a semiconductor memory device 100, and a memory controller 4310 capable of controlling a data processing operation of the semiconductor memory device 100. And the computer system 4300 further includes a central processing unit 4320, an image sensor 4330, and a display device 4340.

The image sensor 4330 converts an optical image into a digital signal and transfer the converted digital signal to the central processing unit 4320 or the memory controller 4310. Under control by the central processing unit 4320, the converted digital signal may be displayed through the display device 4340 or stored in the semiconductor memory device 100 by the memory controller 4310.

Data stored in the semiconductor memory device 100 may be outputted by way of the display device 4340 in response to the control by the central processing unit 4320 or the memory controller 4310.

According to an embodiment, the memory controller 4210 capable of controlling an operation of the semiconductor memory device 100 may be implemented as a part of the central processing unit 4320 or as another chip in addition to the central processing unit 4320.

As stated above, a computer system according to the disclosed embodiments is provided to include a semiconductor memory device having a first memory block and a second memory block that is different from the first memory, a memory controller accessing the first and second memory blocks respectively by address signals, and a central processing unit allocating a memory space to the first memory for system management and a memory space to the second memory block for data storage. Therefore the computer system is more facilitated in accessing the semiconductor memory device by way of address signals.

The foregoing is illustrative of embodiments and is not to be construed as limiting thereof. Although a few embodiments have been described, those skilled in the art will readily appreciate that many modifications are possible without materially departing from the novel teachings and advantages. Accordingly, all such modifications are intended to be included within the scope of this inventive concept as defined in the claims. In the claims, means-plus-function clauses are intended to cover the structures described herein as performing the recited function, and not only structural equivalents but also equivalent structures.

What is claimed is:

1. A semiconductor memory device comprising:
a first memory block of a first type of memory; and
a second memory block of a second type of memory having a different type from the first type, wherein the first and second memory blocks are integrated in a unitary die;
wherein a first address region of the first memory block and a second address region of the second memory block are included in the same address domain,
wherein each of the first and second memory blocks is accessed by an address signal including an address of the address domain, and
wherein the second memory block is a nonvolatile memory.

2. The device of claim 1, wherein the same address domain refers to a set of consecutive addresses, wherein the addresses of the second address region immediately follow the addresses of the first address region.

3. The device of claim 1, wherein the first and second memory blocks are each driven by different AC parameters.

4. The device of claim 1, wherein the first memory block is configured as a system operating memory.

5. The device of claim 1, wherein the first memory block is a volatile memory.

6. The device of claim 5, wherein the first memory block includes a DRAM.

7. The device of claim 1, wherein the second memory block is configured as a memory for storing data.

8. The device of claim 1, wherein the nonvolatile memory includes one of a flash memory device, a Ferroelectric Random Access Memory (FeRAM), a Phase-change Random Access Memory (PRAM), and a Magnetic Random Access Memory (MRAM).

9. A computer system comprising:
a semiconductor memory device including a first memory block and a second memory block that has different operational characteristics from the first memory block;
a memory controller configured to access the first and second memory blocks by an address signal; and
a central processing unit configured to, by way of the memory controller, allocate a memory space to the first memory block for system management and allocate a memory space to the second memory block for data storage,
wherein the first and second memory blocks are integrated in a unitary die.

10. The computer system of claim 9, wherein an address region of the semiconductor memory device includes a first address region for accessing the first memory block and a second address region for accessing the second memory block.

11. The computer system of claim 9, wherein the first and second memory blocks are each driven by different AC parameters.

12. The computer system of claim 9, wherein the second memory block is a nonvolatile memory.

13. The computer system of claim 12, wherein the nonvolatile memory includes one of a flash memory device, a Ferroelectric Random Access Memory (FeRAM), a Phase-change Random Access Memory (PRAM), and a Magnetic Random Access Memory (MRAM).

14. A memory access method in a semiconductor memory device that includes a first memory block of a first type of memory on a die and a second memory block of a second type of memory having a different type from the first type on the same die, the memory access method comprising:
accessing a first address region of the first memory block by a first address signal including a first address;
accessing a second address region of the second memory block by a second address signal including a second address, wherein:
the first address and second address are part of the same address domain, and
the second memory block is a nonvolatile memory.

15. The method of claim 14, wherein:
the first memory block is a volatile memory.

16. The method of claim 15, further comprising:
using the first memory block as a memory space for managing a computer system; and
using the second memory block as a memory space for storing data.

17. The method of claim 14, wherein the same address domain includes a set of consecutive addresses, wherein the addresses of the second address region immediately follow the addresses of the first address region.

18. The method of claim 14, further comprising:
applying first AC parameters to the first address region; and
applying second AC parameters to the second address region, the second AC parameters different from the first AC parameters.

* * * * *